United States Patent
Huang et al.

(10) Patent No.: US 7,291,396 B2
(45) Date of Patent: Nov. 6, 2007

(54) THERMAL INTERFACE MATERIAL AND METHOD FOR MAKING THE SAME

(75) Inventors: Hua Huang, Beijing (CN); Chang-Hong Liu, Beijing (CN); Shou-Shan Fan, Beijing (CN)

(73) Assignees: Tsinghua University, Beijing (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 13 days.

(21) Appl. No.: 11/321,141

(22) Filed: Dec. 29, 2005

(65) Prior Publication Data
US 2006/0234056 A1    Oct. 19, 2006

(30) Foreign Application Priority Data
Apr. 14, 2005    (CN) .................... 2005 1 0034237

(51) Int. Cl.
*B32B 9/00* (2006.01)
(52) U.S. Cl. .................... 428/408; 977/742
(58) Field of Classification Search ............ 428/408; 165/185; 423/445; 977/742
See application file for complete search history.

(56) References Cited

U.S. PATENT DOCUMENTS

| 6,350,488 | B1 | 2/2002 | Lee et al. |
| 6,407,922 | B1 | 6/2002 | Eckblad et al. |
| 2004/0009353 | A1* | 1/2004 | Knowles et al. ......... 428/411.1 |
| 2005/0061496 | A1* | 3/2005 | Matabayas Jr. ............. 165/185 |
| 2005/0255304 | A1* | 11/2005 | Brink ....................... 428/209 |

OTHER PUBLICATIONS

Berber, Savas et al., "Unusually High Thermal Conductivity of Carbon Nanotubes," *Physical Review Letters*, vol. 84, No. 20, pp. 4613-4616 (2000).
Fan, Shoushan et al., "Self-Oriented Regular Arrays of Carbon Nanotubes and Their Field Emission Properties," *Science*, vol. 283, pp. 512-514 (1999).
Liu, Liang et al., "Isotope Labeling of Carbon Nanotubes and Formation of $^{12}$C-$^{13}$C Nanotube Junctions," *J. Am. Chem. Soc.*, vol. 123, pp. 11502-11503 (2001).

* cited by examiner

*Primary Examiner*—Jennifer McNeil
*Assistant Examiner*—Daniel Miller
(74) *Attorney, Agent, or Firm*—Morris Manning Martin LLP; Tim Tingkang Xia, Esq.

(57) ABSTRACT

A thermal interface material includes a matrix and carbon nanotubes. The matrix includes a first surface and an opposite second surface. The carbon nanotubes are embedded in the matrix uniformly. The carbon nanotubes extend from the first surface to the second surface, and each carbon nanotube has two opposite ends. At least one of the two opposite ends of the carbon nanotubes are exposed out of one of the first and second surfaces of the matrix. The exposed ends of the carbon nanotubes are elastically bent/embedded in a phase change layer formed thereon.

18 Claims, 3 Drawing Sheets

THERMAL INTERFACE MATERIAL AND METHOD FOR MAKING THE SAME

CROSS-REFERENCES TO RELATED APPLICATIONS

This application is related to five corresponding U.S. patent applications as follows: application Ser. No. 11/024,513, filed on Dec. 28, 2004, entitled "THERMAL INTERFACE MATERIAL AND METHOD FOR MANUFACTURING SAME", application Ser. No. 11/025,160, filed on Dec. 28, 2004, entitled "METHOD FOR MANUFACTURING CARBON NANOTUBES WITH UNIFORM LENGTH", application Ser. No. 11/089,864, filed on Mar. 25, 2005, entitled "THERMAL INTERFACE MATERIAL AND METHOD FOR MANUFACTURING SAME", a recent application entitled "THERMAL INTERFACE MATERIAL AND METHOD FOR MAKING THE SAME" with application Ser. No. 11/321,315, filed on Dec. 29, 2005, and a recent application entitled "THERMAL INTERFACE MATERIAL AND METHOD FOR MANUFACTURING SAME"with application Ser. No. 11/321,278, filed on Dec. 29, 2005, each having the same assignee as the instant application. The disclosures of the above-identified applications are incorporated herein by reference.

BACKGROUND

1. Technical Field

The invention relates generally to thermal interface materials and methods for making them; and more particularly to a thermal interface material which conducts heat by using carbon nanotubes, and a method for making such thermal interface material.

2. Discussion of the Related Art

Electronic components such as semiconductor chips are becoming progressively smaller, while at the same time heat dissipation requirements thereof are increasing. Commonly, a thermal interface material is utilized between the electronic component and a heat sink in order to efficiently dissipate heat generated by the electronic component.

A conventional thermal interface material is made by diffusing particles with a high heat conduction coefficient in a base material. The particles can be made of graphite, boron nitride, silicon oxide, alumina, silver, or other metals. However, a heat conduction coefficient of the thermal interface material is now considered to be too low for many contemporary applications, because it cannot adequately meet the heat dissipation requirements of modem electronic components.

A new kind of thermal interface material has recently been developed. The thermal interface material is obtained by fixing carbon fibers with a polymer. The carbon fibers are distributed directionally, and each carbon fiber can provide a heat conduction path. A heat conduction coefficient of this kind of thermal interface material is relatively high. However, the thickness of this kind thermal interface material is limited to be greater than 40 micrometers, and the heat conduction coefficient of the thermal interface material is inversely proportional to a thickness thereof. In other words, the heat conduction coefficient is limited to a certain value corresponding to a thickness of 40 micrometers. The value of the heat conduction coefficient cannot be increased, because the thickness cannot be reduced.

An article entitled "Unusually High Thermal Conductivity of Carbon Nanotubes" and authored by Savas Berber (page 4613, Vol. 84, Physical Review Letters 2000) discloses that a heat conduction coefficient of a carbon nanotube can be 6600 W/mK (watts/milliKelvin) at room temperature.

U.S. Pat. No. 6,407,922 discloses another kind of thermal interface material. The thermal interface material is formed by injection molding, and has a plurality of carbon nanotubes incorporated in a matrix material. A first surface of the thermal interface material engages with an electronic element, and a second surface of the thermal interface material engages with a heat sink. The second surface has a larger area than the first surface, so that heat can be uniformly spread over the larger second surface.

However, the thermal interface material formed by injection molding is relatively thick. This increases a bulk of the thermal interface material and reduces its flexibility. Furthermore, the carbon nanotubes are disposed in the matrix material randomly and multidirectionally. This means that heat does not necessarily spread uniformly through the thermal interface material. In addition, the heat does not necessarily spread directly from the first surface engaged with the electronic element to the second surface engaged with the heat sink.

What is needed, therefore, is a thermal interface material that has a low thermal interface resistance and a high heat conducting efficiency.

What is also needed, therefore, is a method for making the above-described thermal interface material.

SUMMARY

In accordance with one embodiment, a thermal interface material includes a matrix and a plurality of carbon nanotubes embedded in the matrix. The matrix has a first surface and an opposite second surface. The carbon nanotubes extend from the first surface to the second surface, and each carbon nanotube has two opposite ends. At least one of the two ends of each carbon nanotube is exposed out of at least one of the first and second surfaces of the matrix. The exposed end of each carbon nanotube is elastically bent/ embedded in a phase change layer formed thereon.

In accordance with another embodiment, a method for making the thermal interface material includes the steps of:
(a) providing a plurality of carbon nanotubes having two opposite ends;
(b) forming a protective layer on at least one of the two ends of the carbon nanotubes;
(c) inserting curable liquid matrix material into clearances among the carbon nanotubes, and curing the liquid matrix material;
(d) removing the protective layer to expose at least one of the two ends of the carbon nanotubes; and
(e) elastically bending/embedding the exposed end of each carbon nanotube in a phase change layer formed thereon.

Other objects, advantages and novel features of the invention will become more apparent from the following detailed description when taken in conjunction with the accompanying drawings.

BRIEF DESCRIPTION OF THE DRAWINGS

Many aspects of the thermal interface material and related method can be better understood with reference to the following drawings. The components in the drawings are not necessarily to scale, the emphasis instead being placed upon clearly illustrating the principles of the present thermal

DETAILED DESCRIPTION OF THE INVENTION

Embodiments of the present thermal interface material and related method will now be described in detail below and with reference to the drawings.

Figure 1:
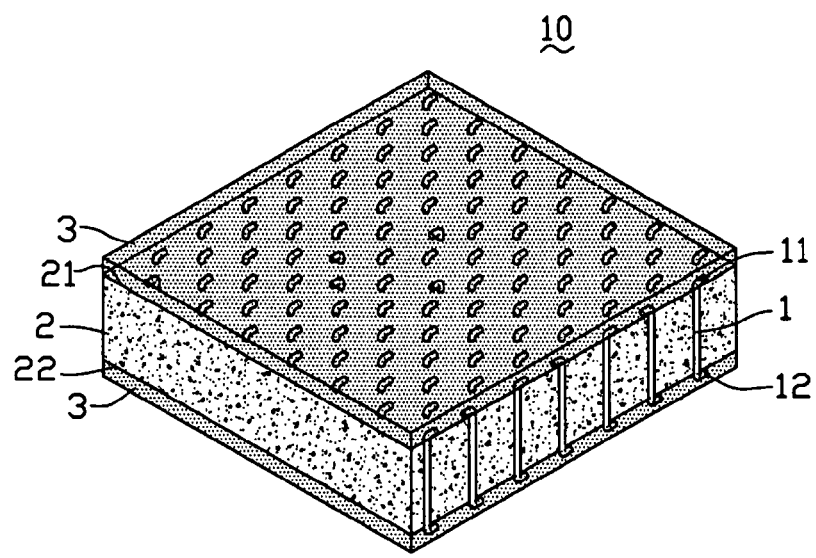
FIG. 1 is a perspective view of a thermal interface material according to a preferred embodiment.
Figure 2:
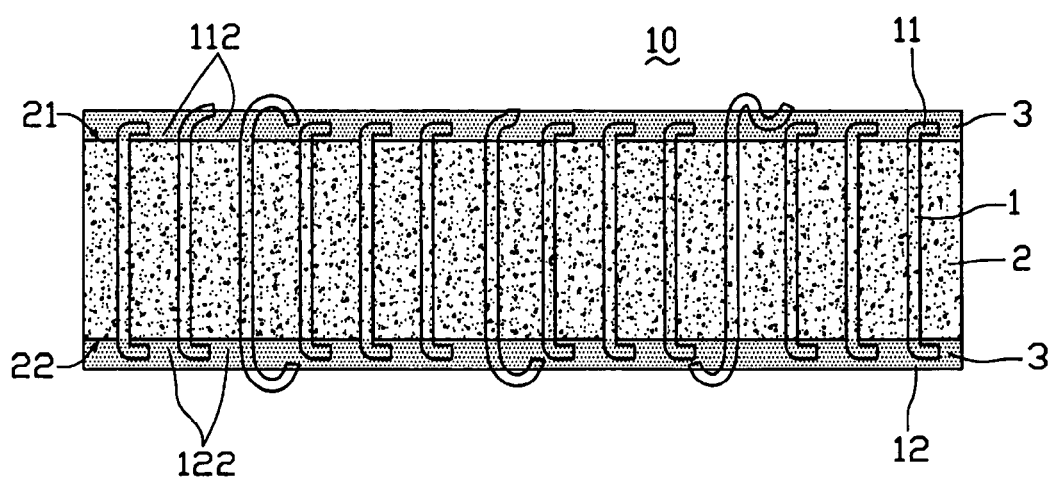
FIG. 2 is a schematic side view of the thermal interface material of FIG. 1.

Referring to FIGS. 1 and 2, a thermal interface material (TIM) 10 includes a matrix 2, a plurality of carbon nanotubes (CNTs) 1, and dual phase change layers 3. The matrix 2 has a first surface 21 and an opposite second surface 22. The CNTs 1 are embedded in the matrix 2 uniformly. The CNTs 1 each include a carbon nanotube body submerged into the matrix 2 and two opposite ends, i.e., a first end 11 and an opposite second end 12. The two opposite ends 11 and 12 are exposed out of the first and second surfaces 21, 22 of the matrix 2, respectively. The dual phase change layers 3 are formed on the two ends 11 and 12, respectively.

The first and second surfaces 21, 22 of the matrix 2 are substantially parallel to one another. The matrix 2 preferably has a thickness in the range from 1 to 1000 micrometers. In the preferred embodiment, the thickness of the matrix 2 is 20 micrometers. The matrix 2 is comprised of, for example, a macromolecular material selected from the group consisting of silicone elastomer, polyester, polyvinyl chloride, polyvinyl alcohol, polyethylene, polypropylene, epoxy resin, polycarbonate resin, polyoxymethylene, and polyacetal.

The CNTs 1 are beneficially in a form of an aligned CNTs array. The carbon nanotube bodies are substantially parallel to each other. Further, the carbon nanotube bodies are substantially perpendicular to the first surface 21 and the second surface 22. Thus, each CNT 1 can provide a heat conduction path in a direction perpendicular to a selected main heat-absorbing surface of the TIM 10.

In the illustrated embodiment (e.g., see FIG. 2), each CNT 1 extends out of the first and second surfaces 21, 22 of the matrix 2, thereby exposing the first and second ends 11, 12. Alternatively, only one of the first and second ends 11, 12 of the CNTs 1 extends out of the first and second surfaces 21, 22 of the matrix 2, thereby exposing the corresponding first or second ends 11, 12. In that case, only a single phase change layer 3 is formed on the corresponding exposed ends, i.e., the first or second ends 11, 12.

The dual phase change layers 3 are formed on the first and second surfaces 21, 22, respectively. The dual phase change layers 3 are configured, for example, for filling clearances 112, 122 between the exposed first and second ends 11, 12 of adjacent CNTs 1. The first and second ends 11, 12 are elastically bent/embedded in a respective phase change layer 3. The bending direction of the ends 11, 12 of the CNTs 1 can be in a consistent direction or in random directions. The two ends 11, 12 of any single CNT 1 can be elastically bent/embedded in the dual phase change layer 3 in different directions. Further, some ends 11, 12 of the CNTs 1 can be partially bent/embedded in the phase change layers 3.

Each phase change layer 3 preferably has a thickness in the range from 1 to 100 micrometers. In the preferred embodiment, the thickness of each phase change layer 3 is 10 micrometers. Each phase change layer 3 is comprised of, e.g., a phase change material selected from the group consisting of paraffin, polyolefin, low molecular weight polyester, low molecular weight epoxy resin, and low molecular weight polyacrylate. Each phase change layer 3 preferably has a desirable phase change temperature, which corresponds to an operating temperature of a heat-generating element (e.g., an electronic element). For example, the phase change temperature may be in the range from about 20° C. to about 90° C.

Figure 3:
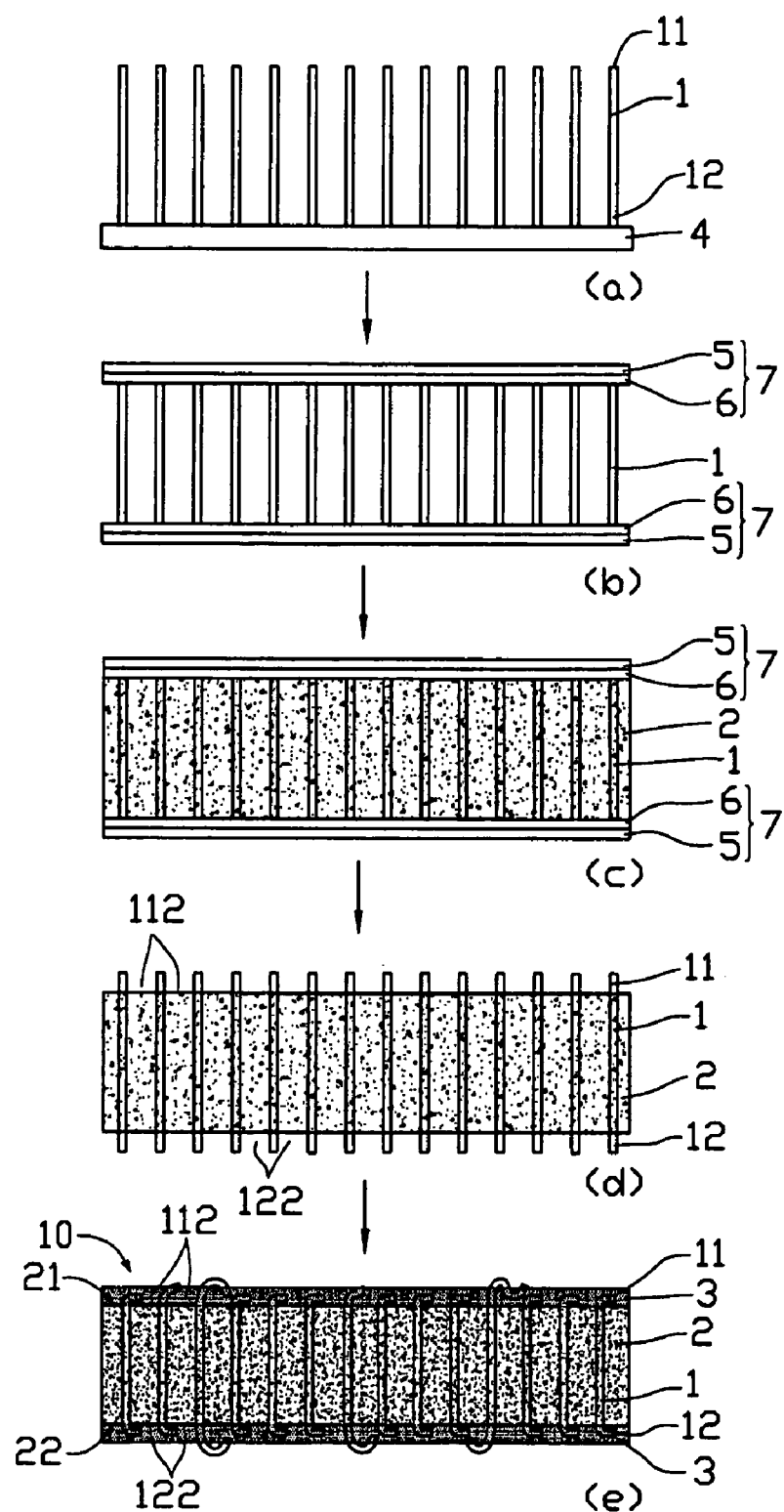
FIG. 3 illustrates a method for making the thermal interface material shown in FIG. 2.

FIG. 3 illustrates a method for making the above-described TIM 10. In the illustrated embodiment, the method includes the following steps:

(a) providing a plurality of CNTs 1 each having two opposite ends 11, 12;

(b) forming two protective layers 7 on the two ends 11, 12 of the CNTs 1;

(c) inserting curable liquid matrix material into clearances among the CNTs 1 and curing the liquid matrix material to form a matrix 2;

(d) removing the protective layers 7 to expose the two ends 11, 12 of the CNTs 1; and (e) elastically bending/embedding the exposed ends 11, 12 of each CNT 1 in a corresponding phase change layer 3 formed thereon.

In step (a), the CNTs 1 are formed by a method selected from the group consisting of a chemical vapor deposition (CVD) method, a plasma-enhanced chemical vapor deposition (PECVD) method, and a hot-filament chemical vapor deposition (HFCVD) method. In the preferred embodiment, the CNTs 1 are formed by a CVD method. Reference is made, to an article entitled "Self-Oriented Regular Arrays of CNTs and Their Field Emission Properties", Science, 1999, Vol. 283, pp. 512-514.

In brief, a substrate 4 (e.g., a silicon substrate) is coated with an Fe film 5 nm thick, and then annealed in air at 300° C. The growth of CNTs 1 is then performed in a CVD chamber using ethylene as a feed gas at 700° C. As shown in FIG. 3(*a*), the CNTs 1 are formed on the substrate 4. The CNTs 1 each has a first end 11 and an opposite second end 12. The CNTs 1 are substantially parallel to one another. The CNTs 1 can be controlled to a predetermined height in accordance with the thickness of the matrix 2, by adjusting a reaction time of the feed gas. The CNTs 1 advantageously have an outer diameter of about 12 nm. The substrate 4 can be gently stripped away from the CNTs 1, thereby obtaining the isolated CNTs 1.

In step (b), briefly, a pressure sensitive adhesive layer 6 is coated on a supporting film 5 comprised of a polymer (e.g., polyester), thereby forming a protective layer 7. Then the protective layer 7 is formed on the first ends 11 (see FIG. 3(*a*)) of the as-prepared CNTs 1 by gently pressing the pressure sensitive adhesive layer 6 adjacent the matrix 2, thereby securing the first ends 11 of the CNTs 1 in the protective layer 7. Further, another protective layer 7 can be formed on the second ends 12 (see FIG. 3(*a*)) of the CNTs 1 by a step similar to step (b). Thus, the two ends 11, 12 of the CNTs 1 are secured in corresponding protective layers 7, as shown in FIG. 3(*b*). Each protective layer 7 advantageously has a thickness of about 0.05 mm.

Alternatively, after the formation of the protective layer 7 on the first ends 11 of the CNTs 1, the CNTs 1 are directly taken to the next step (c). In that situation, only the first ends 11 of the CNTs 1 are covered by the protective layer 7, and subsequently extend out of a corresponding surface of the matrix 2 according to the following steps.

In step (c), the insertion is performed by for example, submerging the CNTs 1 into a liquid matrix material, and then curing the liquid matrix material in a vacuum chamber at room temperature for 25 hours. As shown in FIG. 3(*c*), the cured matrix 2 is thereby disposed in clearances among the adjacent CNTs 1. The liquid matrix material is advantageously a polymer solution typically comprised of one of the above-mentioned macromolecular materials. Taking silicone elastomer as an example, the liquid matrix material includes an S160 solution (i.e., Sylgard 160 produced by Dow Corning) and ethyl acetate in a volume ratio of 1:1.

In step (d), each protective layer 7, i.e., the supporting film 5 and pressure sensitive adhesive layer 6, is removed thereby exposing the first and second ends 11, 12 of the CNTs 1 out of the first and second surfaces 21, 22 of the matrix 2. The protective layer 7 may be removed, for example, by directly stripping off the supporting film 5 and subsequently dissolving away the remaining pressure sensitive adhesive layer 6 in a xylene solution. Thus, a composite film of the CNTs 1 embedded in the S160 matrix 2 can be obtained, as shown in FIG. 3(*d*). After step (d), the outline of the CNTs 1 of the composite film is essentially the same as that of the original CNTs 1. That is, the CNTs 1 are still aligned in the S160 matrix 2.

Further treatments on the first and/or second surfaces 21, 22 of the matrix 2 can be optionally performed (e.g. by reactive ion etching (RIE)) to ensure all the ends 11, 12 are exposed. The RIE process can be carried out, for example, by using oxygen plasma at a pressure of 6 Pa and with a power of 150 W for 15 minutes at each surface 21, 22 of the matrix 2.

In step (e), the exposed ends 11, 12 of each CNT 1 can be elastically bent/embedded in a respective phase change layer 3. This can be performed, e.g., by a method selected from the group consisting of a pressing method, a polishing method, a rubbing/scraping method, and a cutting method.

The pressing method beneficially includes the steps of: forming a phase change layer 3 on two surfaces of two panels respectively; sandwiching the CNTs 1 embedded in the matrix 2 between the two panels; pressing and heating the phase change layers 3 so as to bend/embed the exposed ends 11, 12 of each CNT 1 thereinto; and curing the phase change layers 3 and removing the two panels, thereby forming the TIM 10.

In the pressing and heating step, the heating temperature is at/above a phase change temperature of the phase change layers 3 thereby melting the phase change layers 3. Thus, the exposed ends 11, 12 of each CNT 1 are readily elastically bent/embedded into the phase change layers 3 due to a pressing action. In this case, the exposed ends 11, 12 of the CNTs 1 are elastically bent/embedded into the phase change layers 3 in random directions. Because the CNTs 1 have springback characteristics, the pressed ends 11, 12 of each CNT 1 spring back and beneficially extend out of the phase change layers 3 once the phase change layers 3 are melted.

The polishing method can be performed, for example, in a chemical mechanical polishing machine or a grinding and polishing machine. In brief, the polishing method includes the steps of: admixing a phase change material into an abrasive; and polishing the exposed ends 11, 12 of the CNTs 1 by using the abrasive with the phase change material. Alternatively, the polishing method may include the steps of: forming a phase change layer on the exposed ends 11, 12 of the CNTs 1; and polishing the exposed ends 11, 12 of the CNTs 1 so as to bend/embed the exposed ends 11, 12 of the CNTs 1 therein. During either of these polishing methods, the phase change layer/material is heated to/above the phase change temperature, and then is cured so as to elastically bend/embed the exposed ends 11, 12 of the CNTs 1 therein.

The rubbing/scraping method includes the steps of: forming a phase change layer 3 on each of the exposed ends 11, 12 of the CNTs 1, and allowing the exposed ends of the CNTs 1 to extend out of the phase change layers 3; and rubbing/scraping the extending portions of the exposed ends 11, 12 of the CNTs 1 with a rough substrate to bend/embed the exposed ends 11, 12 of the CNTs 1 in the phase change layers 3. The formation of each phase change layer 3 on the exposed ends 11, 12 of the CNTs 1 is performed, for example, by directly adhering a phase change material sheet on the corresponding surface 21, 22 of the matrix 2 below the phase change temperature. Alternatively, the formation of each phase change layer 3 is performed, e.g., by the steps of: submerging the corresponding surface 21, 22 of the matrix 2 into a liquid phase change material solution, and then adsorbing and thus removing unwanted portions of the liquid phase change material by using a filter paper.

After the formation of the phase change layers 3 on the exposed ends 11, 12 of the CNTs 1, the exposed ends 11, 12 are further rubbed/scraped to bend/embed the exposed ends 11, 12 in the phase change layers 3. In brief, the rubbing/scraping step can be performed, for example, by moving the exposed ends 11, 12 of the CNTs 1 across the still rough substrate, or by moving the rough substrate across the exposed ends 11, 12 of the CNTs 1. The bending direction of the exposed ends 11, 12 depends on the rubbing/scraping direction of the rough substrate or the exposed ends 11, 12.

The cutting method includes the steps of: submerging the CNTs 1 embedded in the matrix 2 into a liquid phase change material; curing the liquid phase change material; and cutting the cured phase change material formed on the exposed ends 11, 12 of the CNTs 1 by using a cutter in a direction perpendicular to long axes of the CNTs 1. The cut end of each CNT 1 may be open, and is elastically bent/embedded into the cured phase change material. The bending direction of the ends 11, 12 depends on the cutting direction of the cutter.

In addition, by decreasing the thickness of each phase change layer 3 formed on the ends 11, 12 of the CNTs 1, the ends 11 and/or 12 of the CNTs 1 can spring back and further extend out of the surface of the corresponding phase change layer 3 once the phase change layer 3 is at/above the phase change temperature.

In the case when one of the two ends 11/12 of the CNTs 1 remain covered by the corresponding protective layer 7, only the other ends 12/11 of the CNTs 1 are correspondingly exposed out of the corresponding surface 22/21 of the matrix 2 after the above-described steps (c) and (d). Accordingly, the other ends 12/11 of the CNTs 1 are submerged in the liquid matrix material. Thus, in step (e), only one phase change layer 3 is required to bend/embed the exposed ends 12/11 of the CNTs 1 therein.

Figure 4:
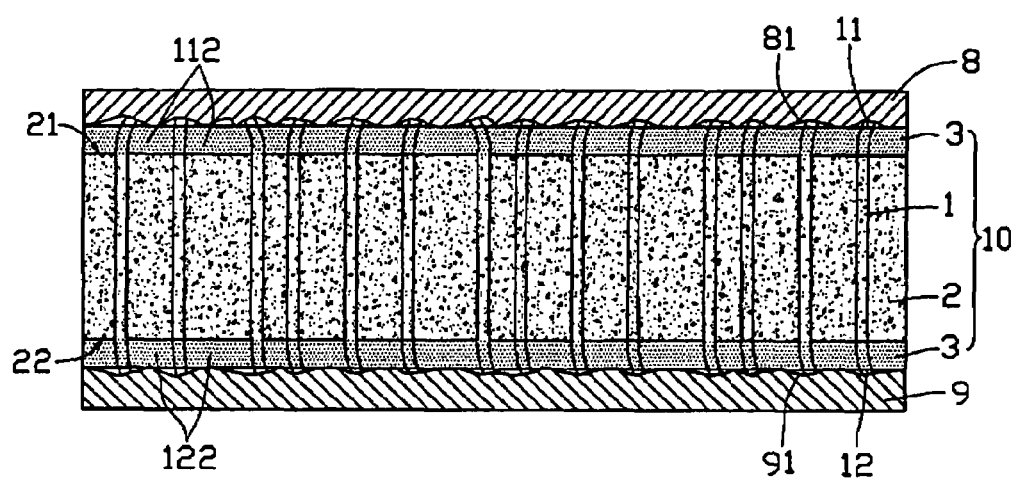
FIG. 4 is a schematic, cross-section view of the thermal interface material shown in FIG. 2 applied between an electronic element and a heat sink.

FIG. 4 illustrates an application of the TIM 10. The TIM 10 is sandwiched between a heat sink 8 and a heat-generating element 9, for providing good heat contact between the heat sink 8 and the heat-generating element 9. In operation, the heat-generating element 9 generates heat, which is immediately conducted to the phase change layer 3. Then the phase change layer 3 is melted, thereby allowing the bent ends (i.e., the second ends 12) to extend out of the phase change layer 3 by reason of the springback characteristics of the CNTs 1. The springback ends 12 can exert partial pressure on a topside 91 of the heat-generating element 9, due to inner stresses of the deformed CNTs 1. Next, heat is conducted to the other phase change layer 3 formed on the first ends 11. Similarly to the second ends 12, the first ends 11 extend out of the phase change layer 3 and exert partial pressure on an underside 81 of the heat sink 8.

The partial pressures of the ends 11, 12 of the CNTs 1 can ensure that the CNTs 1 have excellent heat contact with the heat-generating element 9 and the heat sink 8, thereby decreasing heat resistance between the respective heat conducting interfaces. Furthermore, the partial pressures of the two ends 11, 12 are generally above 3 MPa. Thus a fastening force, which is required for packing the TIM 10 and is generally about 0.5 MPa, can be decreased or even be dispensed with altogether by directly utilizing the partial pressures of the two ends 11, 12.

The phase change layers 3 are capable of filling the clearances 112, 122 between the exposed first and/or second ends 11, 12 of adjacent CNTs 1. Thus, the thermal interface resistances induced by the clearances 112, 122 are decreased. As a result, the heat conducting efficiency of the TIM 10 is further enhanced.

It is understood that the above-described embodiments and methods are intended to illustrate rather than limit the invention. Variations may be made to the embodiments and methods without departing from the spirit of the invention. Accordingly, it is appropriate that the appended claims be construed broadly and in a manner consistent with the scope of the invention.

What is claimed is:

1. A thermal interface material comprising:
   a matrix having a first surface and an opposite second surface;
   at least one phase change layer formed on at least one of the first surface and the second surface, the at least one phase change layer existing at a temperature below a phase change temperature of the at least one phase change layer; and
   a plurality of carbon nanotubes embedded in the matrix, the carbon nanotubes extending from the first surface to the second surface and each having two opposite ends, at least one of the two ends of the carbon nanotubes being exposed out of a corresponding at least one of the first and second surfaces of the matrix to form at least one plurality of exposed ends, the at least one plurality of exposed ends of the carbon nanotubes being elastically bent and/or embedded in the corresponding at least one phase change layer formed thereat;
   wherein when the at least one phase change layer is exposed to a temperature at or above the phase change temperature thereof, the at least one phase change layer changes into a liquid state, and the at least one plurality of exposed ends of the carbon nanotubes elastically spring back and extend out of the corresponding at least one phase change layer.

2. The thermal interface material as claimed in claim 1, wherein a part or a whole of each of the at least one plurality of exposed ends of the carbon nanotubes are elastically bent and/or embedded in the corresponding at least one phase change layer formed thereat.

3. The thermal interface material as claimed in claim 1, wherein the at least one phase change layer has a thickness in the range from 1 to 100 micrometers.

4. The thermal interface material as claimed in claim 1, wherein the at least one phase change layer is comprised of a phase change material selected from the group consisting of paraffin, polyolefin, low molecular weight polyester, low molecular weight epoxy resin, and low molecular weight poly acrylate.

5. The thermal interface material as claimed in claim 4, wherein the phase change material has a phase change temperature in the range from about 20° C. to about 90° C.

6. The thermal interface material as claimed in claim 1, wherein the carbon nanotubes have carbon nanotubes bodies wholly submerged in the matrix, and the carbon nanotube bodies are substantially parallel to each other.

7. The thermal interface material as claimed in claim 1, wherein the first and second surfaces of the matrix are substantially parallel to each other.

8. The thermal interface material as claimed in claim 7, wherein the carbon nanotube bodies are substantially perpendicular to the first and second surfaces of the matrix.

9. The thermal interface material as claimed in claim 1, wherein the matrix has a thickness in the range from 1 to 1000 micrometers.

10. The thermal interface material as claimed in claim 1, wherein the matrix is comprised of a material selected from the group consisting of silicone elastomer, polyester, polyvinyl chloride, polyvinyl alcohol, polyethylene, polypropylene, epoxy resin, polycarbonate resin, polyoxymethylene, and polyacetal.

11. A thermal management system comprising:
    a heat source;
    a heat sink; and
    a thermal interface material sandwiched between the heat source and the heat sink, the thermal interface material comprising:
    a matrix having a first surface and an opposite second surface;
    at least one phase change layer formed on at least one of the first surface and the second surface, the at least one phase change layer existing at a temperature below a phase change temperature of the at least one phase change layer; and
    a plurality of carbon nanotubes embedded in the matrix, the carbon nanotubes extending from the first surface to the second surface and each having two opposite ends, at least one of the two ends of the carbon nanotubes being exposed out of a corresponding at least one of the first and second surfaces of the matrix to form at least one plurality of exposed ends, the at least one plurality of exposed ends of the carbon nanotubes being elastically bent and/or embedded in the corresponding at least one phase change layer formed thereat;
    wherein when the at least one phase change layer is exposed to a temperature at or above the phase change temperature thereof, the at least one phase change layer changes into a liquid state, and the at least one plurality of exposed ends of the elastically rebound to exert pressure on a corresponding surface of at least one of the heat source and the heat sink.

12. The thermal management system as claimed in claim 11, wherein the at least one phase change layer has a thickness in the range from 1 to 100 micrometers.

13. The thermal management system as claimed in claim 11, wherein the matrix has a thickness in the range from 1 to 1000 micrometers.

14. The thermal management system as claimed in claim 11, wherein the matrix is comprised of a material selected from the group consisting of silicone elastomer, polyester, polyvinyl chloride, polyvinyl alcohol, polyethylene, polypropylene, epoxy resin, polycarbonate resin, polyoxymethylene, and polyacetal.

15. The thermal management system as claimed in claim 11, wherein the at least one phase change layer is comprised of a phase change material selected from the group consisting of paraffin, polyolefin, low molecular weight polyester, low molecular weight epoxy resin, and low molecular weight poly acrylate.

16. The thermal management system as claimed in claim 11, wherein the at least one phase change layer has a phase change temperature in the range from about 20° C. to about 90° C.

17. The thermal management system as claimed in claim 11, wherein the carbon nanotube bodies wholly submerged in the matrix, and the carbon nanotube bodies are substantially parallel to each other.

18. The thermal management system as claimed in claim 11, wherein a part or a whole of each of the at least one plurality of exposed ends of the carbon nanotubes are elastically bent and/or embedded in the corresponding at least one phase change layer formed thereat.

* * * * *